US009213055B2

(12) United States Patent
Yataka et al.

(10) Patent No.: US 9,213,055 B2
(45) Date of Patent: Dec. 15, 2015

(54) SEMICONDUCTOR DEVICE

(71) Applicant: HONDA MOTOR CO., LTD., Tokyo (JP)

(72) Inventors: Shinichi Yataka, Wako (JP); Kumiko Yamauchi, Wako (JP); Toshimitsu Kobori, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 28 days.

(21) Appl. No.: 14/314,035

(22) Filed: Jun. 25, 2014

(65) Prior Publication Data
US 2015/0034952 A1 Feb. 5, 2015

(30) Foreign Application Priority Data
Jul. 30, 2013 (JP) .................. 2013-157366

(51) Int. Cl.
*H01L 27/06* (2006.01)
*G01R 31/26* (2014.01)
(52) U.S. Cl.
CPC .................. *G01R 31/2608* (2013.01)
(58) Field of Classification Search
CPC .......... H01L 29/7393; H03K 17/567
USPC ....................... 257/539
See application file for complete search history.

(56) References Cited

U.S. PATENT DOCUMENTS

| 6,180,966 B1* | 1/2001 | Kohno | H01L 29/7397 257/173 |
| 2006/0215341 A1* | 9/2006 | Sakurai | H03K 17/0828 361/100 |
| 2008/0203533 A1* | 8/2008 | Kaneko | H01L 29/7393 257/566 |
| 2013/0279225 A1* | 10/2013 | Choi | H02M 7/53873 363/98 |
| 2015/0179758 A1* | 6/2015 | Ata | H01L 29/66348 257/140 |

FOREIGN PATENT DOCUMENTS

| JP | 2003-229572 | 8/2003 |
| JP | 2005-050913 | 2/2005 |

* cited by examiner

*Primary Examiner* — Daniel Whalen
(74) *Attorney, Agent, or Firm* — Mori & Ward, LLP

(57) ABSTRACT

A semiconductor device includes a plurality of cells in a main region, a plurality of cells in a sensing region, a transistor, and a gate shut-off time for the sensing region. The transistor is configured to drive each of the plurality of cells in the main region and each of the plurality of cells in the sensing region. The gate shut-off time for the sensing region is set according to D=(Cgs/Cgm)*(Rgs/Rgm) to be earlier than a gate shut-off time for the main region. D indicates a CR delay ratio, Rgm indicates a gate resistance value for the main region and Rgs indicates a gate resistance value for the sensing region in the transistor, and Cgm indicates a parasitic capacitance for the main region and Cgs indicates a parasitic capacitance for the sensing region in the transistor.

11 Claims, 6 Drawing Sheets

SEMICONDUCTOR DEVICE

CROSS-REFERENCE TO RELATED APPLICATIONS

The present application claims priority under 35 U.S.C. §119 to Japanese Patent Application No. 2013-157366, filed Jul. 30, 2013, entitled "Semiconductor Device." The contents of this application are incorporated herein by reference in their entirety.

BACKGROUND

1. Field

The present disclosure relates to a semiconductor device.

2. Description of the Related Art

Semiconductor devices having a current detecting function from the viewpoint of preventing overcurrent and other purposes are proposed. A primary subject in developing such devices is a device that includes two regions of one for performing main functions (main region) and the other for detecting a current flowing in the main region (sensing region) on a single semiconductor substrate from the viewpoint of the overcurrent detection accuracy.

Japanese Unexamined Patent Application Publication Nos. 2005-050913 and 2003-229572 disclose a semiconductor device having a current detecting function and capable of detecting a current flowing in cells in a main region (main current) in accordance with a split flow ratio between the current flowing in the cells in the main region and a current flowing in cells in a sensing region (sensing current). When the split flow ratio between the main current and the sensing current is known, a main current value can be detected from a measured sensing current value.

With the above-described semiconductor device, because the split flow ratio between the main current and the sensing current is obtained in advance with high accuracy, when a current actually flows in the device, a real main current value is accurately detectable using the split flow ratio.

SUMMARY

According to one aspect of the present invention, a semiconductor device includes, a plurality of cells in a main region, a plurality of cells in a sensing region, and a transistor. The transistor drives each of the cells. A gate shut-off time for the sensing region is set earlier than a gate shut-off time for the main region on the basis of $D=(Cgs/Cgm)*(Rgs/Rgm)$, where D indicates a CR delay ratio, Rgm indicates a gate resistance value for the main region and Rgs indicates a gate resistance value for the sensing region in the transistor, and Cgm indicates a parasitic capacitance for the main region and Cgs indicates a parasitic capacitance for the sensing region in the transistor.

According to another aspect of the present invention, a semiconductor device includes a plurality of cells in a main region, a plurality of cells in a sensing region, a transistor, and a gate shut-off time for the sensing region. The transistor is configured to drive each of the plurality of cells in the main region and each of the plurality of cells in the sensing region. The gate shut-off time for the sensing region is set according to $D=(Cgs/Cgm)*(Rgs/Rgm)$ to be earlier than a gate shut-off time for the main region. D indicates a CR delay ratio, Rgm indicates a gate resistance value for the main region and Rgs indicates a gate resistance value for the sensing region in the transistor, and Cgm indicates a parasitic capacitance for the main region and Cgs indicates a parasitic capacitance for the sensing region in the transistor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
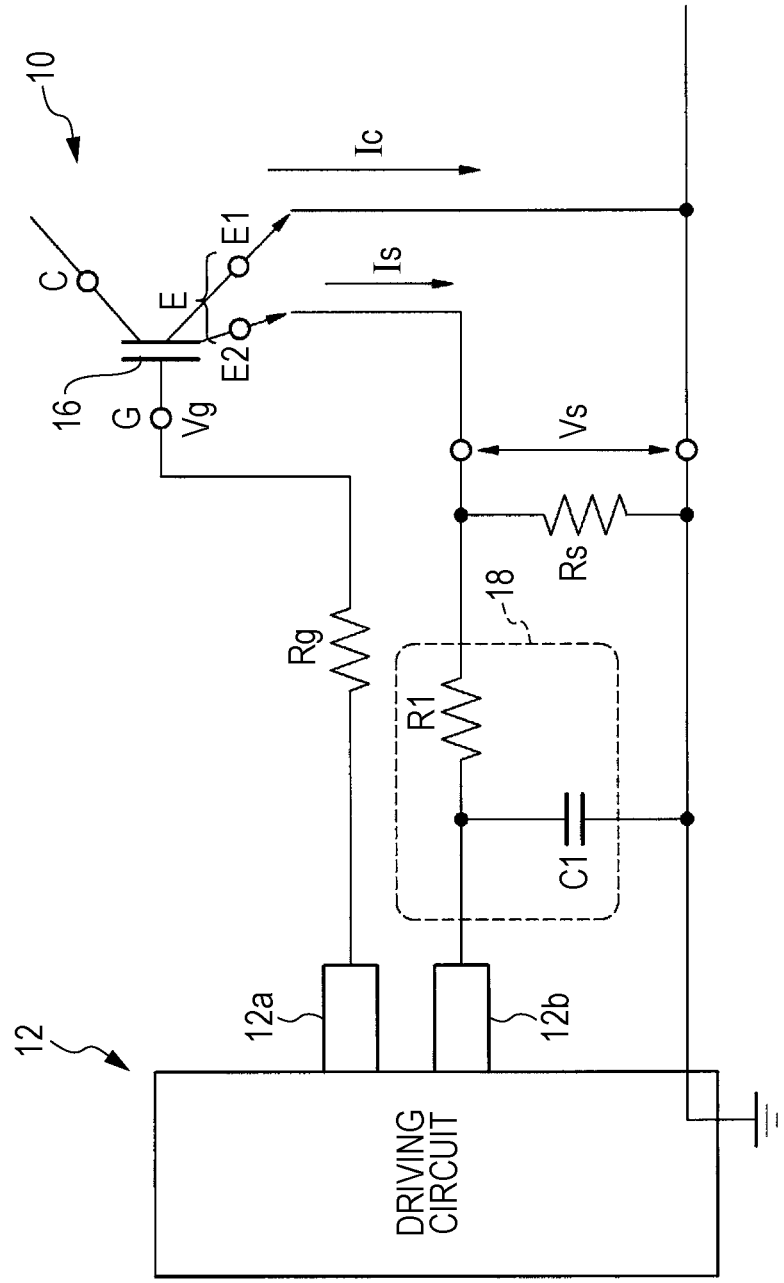
FIG. 1 is an equivalent circuit diagram of a semiconductor device according to an embodiment.

The embodiments will now be described with reference to the accompanying drawings, wherein like reference numerals designate corresponding or identical elements throughout the various drawings.

A semiconductor device according to an embodiment is described in detail below with reference to the drawings.

FIG. 1 is an equivalent circuit diagram of a semiconductor device according to an embodiment. A semiconductor device 10 according to the present embodiment includes a transistor 16 driven by a driving current supplied from a separately disposed driving circuit 12, a group of cells (a plurality of cells) in a main region, and a group of cells (a plurality of cells) in a sensing region (see FIG. 4). In the present embodiment, the transistor 16, the group of cells in the main region, and the group of cells in the sensing region are formed on a semiconductor substrate by a general manufacturing process, and their specific configurations, locations, and manufacturing methods are not particularly limited.

The driving circuit 12 includes a driving terminal 12a for use in supplying a driving current to the transistor 16 and a potential detecting terminal 12b for use in detecting a sensing voltage (potential) described below.

The semiconductor device 10 according to the present embodiment further includes a gate resistor Rg, a sensing resistor Rs, and a resistor-capacitor (RC) filter 18 including a filter resistor R1 and a capacitor C1. In the present embodiment, the gate resistor Rg, sensing resistor Rs, filter resistor R1, and capacitor C1, which are individual components, are mounted on the above-described semiconductor substrate. Specific modes and locations of the above-described components are not particularly limited.

In the present embodiment, the transistor 16 is an insulated-gate bipolar transistor (IGBT). IGBT is a bipolar transistor in which a metal oxide semiconductor field effect transistor (MOSFET) is embedded in a gate electrode. The type of the transistor 16 is not particularly limited, and MOSFET may also be used, instead of IGBT.

The driving terminal 12a in the driving circuit 12 is connected to a gate terminal G in the transistor 16 through the gate resistor Rg for use in adjusting a gate voltage Vg. A collector terminal C in the transistor 16 is connected to a power source for supplying main power. An emitter terminal E in the transistor 16 includes a main-side emitter terminal E1 connected to the cells in the main region and a sensing-side emitter terminal E2 connected to the cells in the sensing region.

The sensing-side emitter terminal E2 is connected to the sensing resistor Rs and the RC filter 18. As described below, the sensing resistor Rs is a resistor for use in measuring a sensing voltage applied to the cells in the sensing region. The RC filter 18 includes the filter resistor R1 and the capacitor C1 and is used for suppressing the occurrence of surge voltage and surge current. In the present embodiment, the RC filter 18 has a first-order low-pass filter form including the filter resistor R1 in series with input signals and the capacitor C1 in parallel with output signals (output current). The form of the RC filter 18 is not particularly limited, and filters of other forms using coils or operational amplifiers may also be used.

As described above, in the present embodiment, the emitter terminal E in the transistor 16 includes the main-side emitter terminal E1 connected to the cells in the main region and the sensing-side emitter terminal E2 connected to the cells in the sensing region and can be construed to include at least two emitter terminals. That is, the semiconductor device 10 extracts a collector-emitter current in the transistor 16 in such a way that not only a main current Ic used in main functions is extracted at the main-side emitter terminal E1 but also a sensing current Is corresponding to, for example, one part in several thousand equal parts to one part in several tens of thousands equal parts of the main current is extracted (the magnitude of the sensing current Is is not limited to the above description and may be any value). A voltage occurring in the sensing resistor Rs through which the sensing current Is flows is detected as a sensing voltage at the potential detecting terminal 12b in the driving circuit 12. The driving circuit 12 monitors the detected voltage. The monitoring enables grasping of the behavior of the sensing current Is.

That is, because the ratio of the magnitude of the main current Ic and that of the sensing current Is is known in advance from design specifications of the transistor 16, the behavior of the main current Ic can be grasped, the occurrence of an anomalous event, such as overcurrent or a short circuit, can be grasped, and it can be fed back to the driving circuit 12. When the driving circuit 12 grasps the occurrence of the anomalous event, it can perform an action, for example, shut off the overcurrent, and thus the transistor 16 can be protected.

Figure 2:
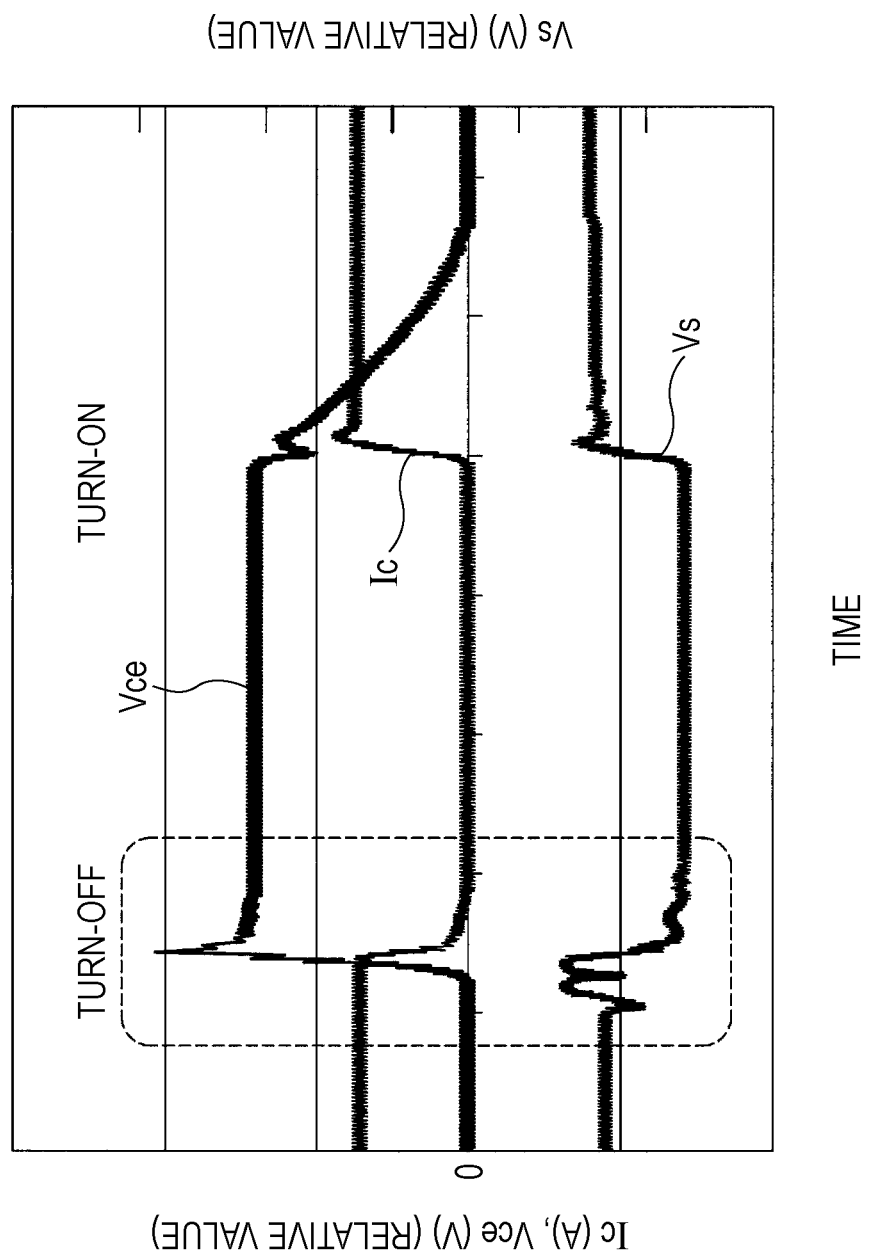
FIG. 2 is a flowchart that illustrates results of detection of values of currents or voltages in portions in the semiconductor device during turn-off.

However, a problem may arise when power is shut off by the semiconductor device 10, that is, when a main current is turned off. The chart in FIG. 2 illustrates values of current or voltage in portions in the semiconductor device 10 during turn-off. When the current flows, the predetermined voltage Vg (e.g., 15 V) is applied to the gate terminal G in the transistor 16. When the voltage Vg at the gate terminal G is rendered zero by a control signal from the driving circuit 12, the transistor 16 becomes an off state (high-resistive state), the main current Ic becomes zero, and a voltage Vce between the collector and emitter increases.

At this time, normally, it is expected that the same behavior occurs in the sensing region and a sensing voltage Vs and the sensing current Is become zero. However, as indicated by the dotted section in FIG. 2, the sensing voltage Vs often shows sudden abnormal high voltage (surge voltage). In such cases, the behavior differs from the behavior of the main current Ic, the voltage and current in the sensing region do not accurately reflect the behaviors of the voltage and current in the main region, and the precision in operation of controlling the semiconductor device 10 may decrease.

A major cause of such an event is a time lag between the gate-off timing in the cells in the main region and that in the sensing region (typically, a delay occurs on the sensor side).

Possible solutions to the above-described problem may be measures (1) and (2) described below. In accordance with these measures, the sensing resistor Rs and the RC filter 18 are included in the semiconductor device 10, as illustrated in FIG. 1.

(1) The RC filter (filter circuit) 18 is disposed between the sensing resistor Rs and the driving circuit 12 to suppress surge voltage and surge current. (2) The resistance of the sensing resistor Rs is changed such that the detection performance is reduced.

It is known that the above measures can reduce an error. For example, before the filter circuit is placed, because of the occurrence of surge voltage and surge current, the main current is misunderstood by the driving circuit 12 as approximately 1.5 times larger than the actual main current, whereas after the filter circuit is placed, misunderstanding of the main current is reduced to approximately 1.3 times larger than the actual main current.

However, the above measures (1) and (2) have a problem described below.

In (1), if a time constant τ of the RC filter 18 (=R1*C1) is increased with the aim of suppressing surges, a response delay occurs in the sensing current, a change in output current lags behind an actual current change. This means that the RC filter 18 causes a delay in detecting overcurrent or a short circuit, whose detection is an original purpose, and means that controlling for protecting the transistor 16 becomes difficult.

That is, the placement of a filter circuit, such as the RC filter 18, may cause a delay in detecting an anomaly, such as overcurrent or a short circuit, whose detection is an original purpose. One possible approach to avoiding this situation is adjustment of the resistance of the sensing resistor Rs in (2).

Figure 3:
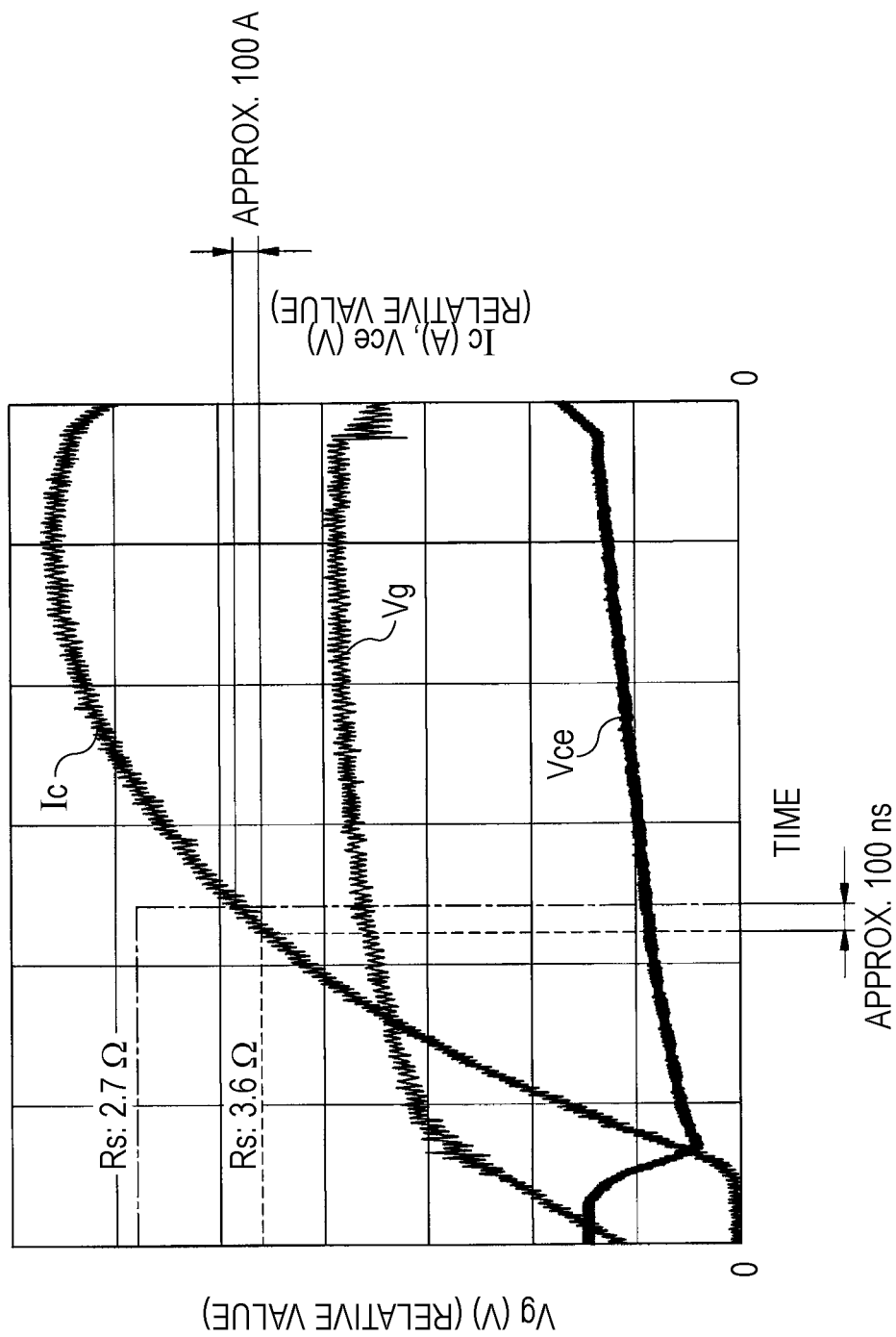
FIG. 3 is a chart that illustrates a problem caused by an RC filter.

FIG. 3 is a chart for describing such circumstances. Here, the switching function in the transistor 16 is disabled, the gate voltage Vg is continuously applied, the transistor 16 is maintained in an on state, and the main current Ic is increased until the transistor 16 is broken.

When the resistance of the sensing resistor Rs is changed, and the current value corresponding to a constant detection voltage being shut off also changes. This means that the gate shut-off time (detection time) also changes. As illustrated in FIG. 3, a change in the resistance value of the sensing resistor Rs varies the gate shut-off time. In the example illustrated in FIG. 3, there is a delay of approximately 100 ns of the gate shut-off time between Rs=3.6Ω and Rs=2.7Ω, and the main current increases by approximately 100 A in that delay.

Accordingly, as the resistance of the sensing resistor Rs reduces, the current required until the detection voltage is reached increases and a period of time up to the gate shut-off increases. That is, a reduction in the resistance of the sensing resistor Rs causes a delay in the time up to shut-off, and the risk of breakage increases. In contrast, when the resistance of the sensing resistor Rs increases, although the sensing current reduces as a whole, because of (sensing current)×(sensing resistance), the sensing voltage Vs increases. Thus the main current Ic is detected excessively, and the risk of frequent occurrence of unnecessary shut-off operation increases.

The present inventors intensively investigated the above-described problem and focused on a gate wiring resistance parasitically added to the inside of the transistor 16 (parasitic resistance). The present inventors conducted further investigation and particularly focused on the existence of a parasitic resistance relating to the main current and that relating to the sensing current. The present inventors found that if the two kinds of parasitic resistances became unbalanced, in particular, if the parasitic resistance relating to the sensing current became too high, shut-off of the group of cells in the sensing region lagged, and as a result, a surge occurred easily in the sensing region.

Figure 4:
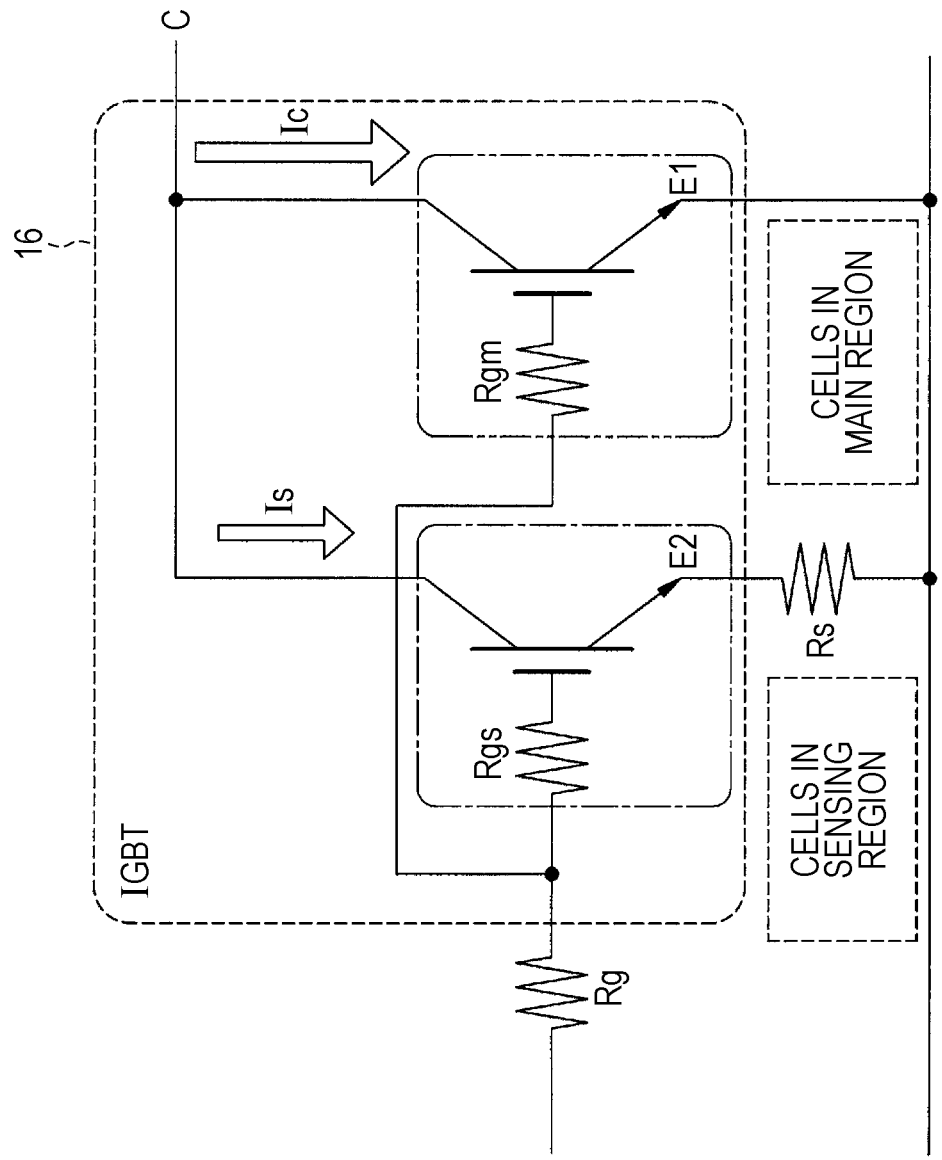
FIG. 4 is an equivalent circuit diagram that schematically illustrates details of parasitic resistances of a transistor.

The above-described fact is described with reference to FIG. 4. FIG. 4 is an equivalent circuit diagram that schematically illustrates details of the parasitic resistance in the transistor 16. The transistor 16 has a main-side internal resistance (gate resistance value for the main region) Rgm relating to a route through which the main current flows (route from the collector terminal C to the main-side emitter terminal E1) and a sensor-side internal gate resistance (gate resistance value for the sensing region) Rgs relating to a route through which the sensing current flows (route from the collector terminal C to the sensing-side emitter terminal E2). The two internal gate resistances Rgm and Rgs are parasitic resistances and unavoidably occur in the transistor.

Figure 5:
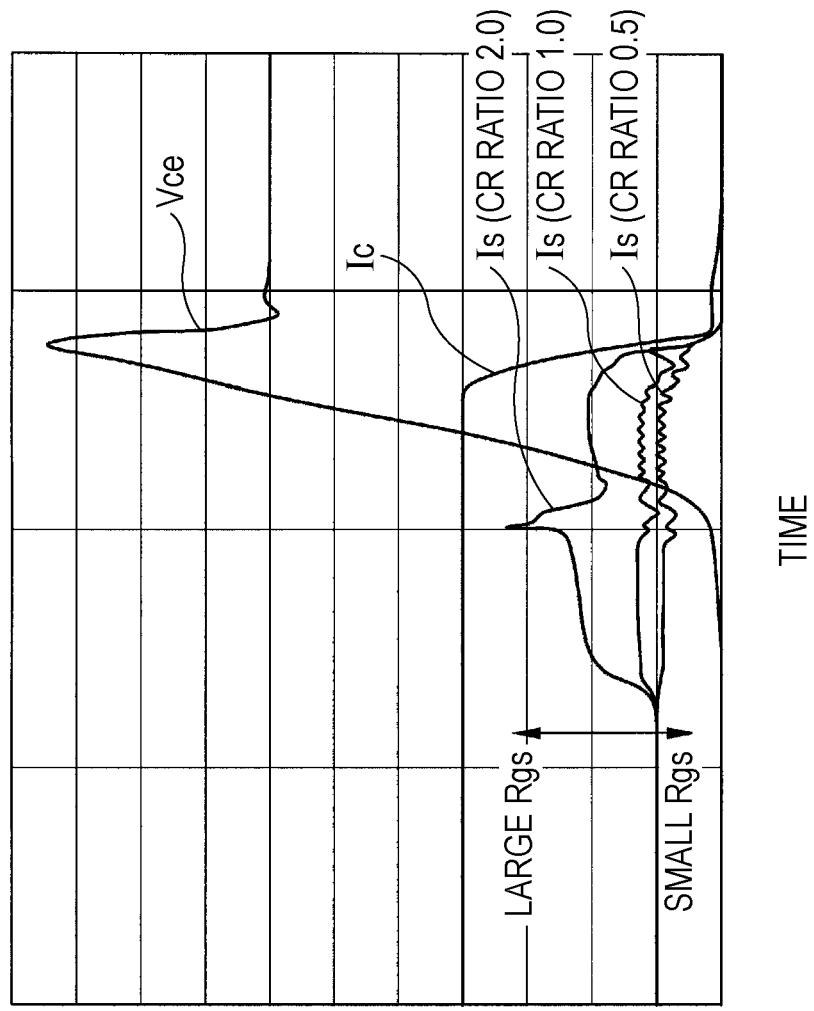
FIG. 5 is an enlarged chart for a rectangular dotted region in FIG. 2 and illustrates changes in a surge with respect to various values of sensor-side internal gate resistance Rgs.

FIG. 5 is an enlarged chart for a rectangular dotted region in FIG. 2 and illustrates changes in a surge with respect to various values of the sensor-side internal gate resistance Rgs. This chart is the one in which it was observed by simulation that the behavior of a surge during turn-off varied with the value of the sensor-side internal gate resistance Rgs inside the transistor 16. "CR ratio" in FIG. 5 indicates "CR delay ratio" described below. FIG. 5 reveals that a transistor with a smaller sensor-side internal gate resistance Rgs also has a smaller CR ratio and clearly has a reduced surge during turn-off.

The present inventors investigated the above-described phenomenon as described below. There are large differences between a current flowing in the main region and a current flowing in the sensing region (main current and sensing current) and between a voltage applied to the main region and a voltage applied to the sensing region (main voltage and sensing voltage), and the sensing region is sensitive to anomalies, such as surges. The present inventors thought that voltage and current surges in the sensing region were able to be suppressed by setting the relationship between the RC time constant for the main region and that for the sensing region at CR (main region)>CR (sensing region) on all occasions and, as a result, making a turn-off operation for the sensing region earlier than that for the main region. This is because it is estimated that if a turn-off operation for the sensing region is later than that for the main region, a current that should flow in the main region may mistakenly flow in the sensing region.

Under such conditions, an excessive current inflow to the sensor side is suppressed (specifically, a current inflow per unit cell is suppressed), and as a result, the surge is reduced. Here, when the parasitic capacitance parasitic on the transistor 16 relating to the route in which the main current flows is a main-side internal capacitance (parasitic capacitance for the main region) Cgm and the parasitic capacitance parasitic on the transistor 16 relating to the route in which the sensing current flows is a sensor-side internal capacitance (parasitic capacitance for the sensing region) Cgs, from the above-described relationship, Cgm*Rgm>Cgs*Rgs is satisfied.

When the above expression is rearranged, (Cgm/Cgs)*(Rgm/Rgs)>1 is satisfied. When this expression is further rearranged, (Cgs/Cgm)*(Rgs/Rgm)<1 is satisfied.

When the ratio between CR for the sensing region and CR for the main region is defined as CR delay ratio D, because D=(Cgs*Rgs)/(Cgm*Rgm)=(Cgs/Cgm)*(Rgs/Rgm), the following expression (1) is satisfied.

$$0<D=(Cgs/Cgm)*(Rgs/Rgm)<1 \quad (1)$$

The ratio Cgs/Cgm is the ratio between the parasitic capacitance for the sensing region and that for the main region. When the parasitic capacitance per cell is the same over the main region and the sensing region, Cgs/Cgm is the same as the ratio between the number of the cells in the sensing region and that for the main region. Accordingly, where the number of the cells in the sensing region is Ns and that in the main region is Nm, the following expression (2) is satisfied.

$$0<D=(Ns/Nm)*(Rgs/Rgm)<1 \quad (2)$$

When the area per cell is the same over the main region and the sensing region, where the area of the sensing region is Ss and that of the main region is Sm, the following expression (3) is satisfied.

$$0<D=(Ss/Sm)*(Rgs/Rgm)<1 \quad (3)$$

For example, when the area Sm of the main region is 2000 and the area Ss of the sensing region is 1, the area ratio (Ss/Sm) is 1/2000. Designing the transistor 16 while focusing on the ratio of the areas and the ratio of the parasitic resistances, which are easily adjustable, enables the occurrence of surge current and surge voltage to be easily suppressed.

Figure 6:
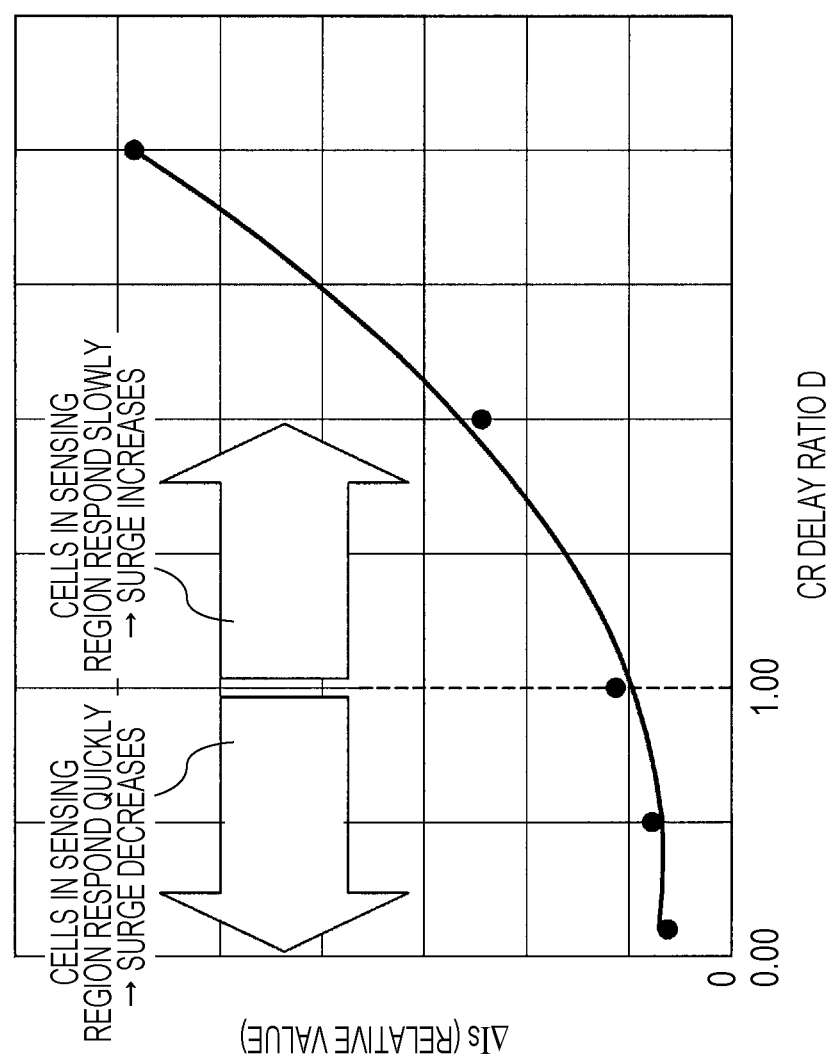
FIG. 6 is a graph that illustrates values of surge current with respect to CR delay ratio D.

FIG. 6 is a graph that illustrates values of surge current with respect to the CR delay ratio D. Here, CR delay ratio D=1 is considered to be a boundary value for which, in theory, when two semiconductors (semiconductor in the main region and semiconductor in the sensing region) are compared, the response for one of the two semiconductors is later than that for the other. Specifically, when the CR delay ratio is smaller than one, the sensing current is turned off early relative to the time of entry of the surge current, and the surge current to the sensing region decreases quickly. In contrast, it is understood that when the CR delay ratio is larger than one, the sensing current is turned off late, and the surge current increases.

As described above, the internal gate resistance parasitic on each of the cells in the sensing region and the cells for the main region and the ratio of the parasitic capacitances, the ratio of the numbers of cells, or the ratio of the areas between the main region and the sensing region are adjusted, and the occurrence of current surges itself is suppressed. That is, the gate shut-off time for the cells in the sensing region can be made earlier by performing design such that 1) the internal gate resistance for the sensing region is reduced in comparison with related-art design and/or 2) the parasitic capacitance for the main region is increased with respect to the parasitic capacitance for the sensing region.

That is, when the gate shut-off time for the sensing region is set earlier than the gate shut-off time for the main region on the basis of CR delay ratio D=(Cgs/Cgm)*(Rgs/Rgm)=(Ns/Nm)*(Rgs/Rgm)=(Ss/Sm)*(Rgs/Rgm), the occurrence of anomalous events, such as surges, can be suppressed. Setting the CR delay ratio D at 0<D<1 enables specifically and readily designing a semiconductor device in which anomalous events do not easily occur.

When all of the cells on a single semiconductor substrate are driven by the common driving circuit 12 and transistor 16 and each of the cells belongs to either one of the main region or the sensing region, the above expression (1) holds for a semiconductor chip made of a single semiconductor substrate. If there is a dummy cell, the expression (1) may be reviewed and considered after it is determined which of the main region and the sensing region the dummy cell belongs to.

Because surges can be directly suppressed without depending on the filter circuit, such as the RC filter, there is no delay in detection, and the semiconductor device can be protected reliably. Even if the filter is used, the filter constant can be lowered, and the performance of detecting an anomaly, such as overcurrent and a short circuit, can be maintained or improved, while the number of parts and the implementation area can be reduced.

Any modifications and improvements on the above-described embodiment are possible. The materials, shapes, dimensions, numerical values, forms, numbers, locations, and the like of the components in the above-described embodiment are not limited.

Because the semiconductor device according to the embodiment can suppress the occurrence of anomalies, such as surge currents to the cells on the sensing side, it can suppress the adverse effects thereon and is applicable in various fields.

A semiconductor device according to an aspect of an embodiment includes a plurality of cells in a main region, a plurality of cells in a sensing region, and a transistor (e.g., transistor 16 in the embodiment described above) that drives each of the cells. A gate shut-off time for the sensing region is set earlier than a gate shut-off time for the main region on the basis of $D=(Cgs/Cgm)*(Rgs/Rgm)$, where D indicates a CR delay ratio, Rgm indicates a gate resistance value for the main region and Rgs indicates a gate resistance value for the sensing region in the transistor, and Cgm indicates a parasitic capacitance for the main region and Cgs indicates a parasitic capacitance for the sensing region in the transistor.

In the configuration according to the aspect of the embodiment, $D=(Ns/Nm)*(Rgs/Rgm)$ may be satisfied, where Nm indicates a number of the cells in the main region and Ns indicates a number of the cells in the sensing region.

In the configuration according to the aspect of the embodiment, $D=(Ss/Sm)*(Rgs/Rgm)$ may be satisfied, where Sm indicates an area of the main region and Ss indicates an area of the sensing region.

According to the above semiconductor device, the occurrence of anomalous events, such as surge current to the cells in the sensing region, can be suppressed.

In the configuration according to the aspect of the embodiment, D may be set at $0<D<1$.

In the configuration according to the aspect of the embodiment, the transistor may include an insulated-gate bipolar transistor (IGBT) including a collector terminal (e.g., collector terminal C in the embodiment described above), a gate terminal (e.g., gate terminal G in the embodiment described above), and at least two emitter terminals (e.g., emitter terminals E1 and E2 in the embodiment described above).

According to the above-described configuration, the semiconductor device in which the occurrence of anomalous events, such as surge voltages and current, is suppressed can be specifically and readily designed.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device comprising:
   a plurality of cells in a main region;
   a plurality of cells in a sensing region; and
   a transistor that drives each of the cells,
   wherein a gate shut-off time for the sensing region is set earlier than a gate shut-off time for the main region on the basis of $D=(Cgs/Cgm)*(Rgs/Rgm)$,
   where D indicates a CR delay ratio,
   Rgm indicates a gate resistance value for the main region and Rgs indicates a gate resistance value for the sensing region in the transistor, and
   Cgm indicates a parasitic capacitance for the main region and Cgs indicates a parasitic capacitance for the sensing region in the transistor.

2. The semiconductor device according to claim 1, wherein $D=(Ns/Nm)*(Rgs/Rgm)$ is satisfied,
   where Nm indicates a number of the cells in the main region and Ns indicates a number of the cells in the sensing region.

3. The semiconductor device according to claim 1, wherein $D=(Ss/Sm)*(Rgs/Rgm)$ is satisfied,
   where Sm indicates an area of the main region and Ss indicates an area of the sensing region.

4. The semiconductor device according to claim 1, wherein D is set at $0<D<1$.

5. The semiconductor device according to claim 1, wherein the transistor comprises an insulated-gate bipolar transistor (IGBT) including a collector terminal, a gate terminal, and at least two emitter terminals.

6. A semiconductor device comprising:
   a plurality of cells in a main region;
   a plurality of cells in a sensing region;
   a transistor configured to drive each of the plurality of cells in the main region and each of the plurality of cells in the sensing region; and
   a gate shut-off time for the sensing region being set according to $D=(Cgs/Cgm)*(Rgs/Rgm)$ to be earlier than a gate shut-off time for the main region, wherein
   D indicates a CR delay ratio,
   Rgm indicates a gate resistance value for the main region and Rgs indicates a gate resistance value for the sensing region in the transistor, and
   Cgm indicates a parasitic capacitance for the main region and Cgs indicates a parasitic capacitance for the sensing region in the transistor.

7. The semiconductor device according to claim 6, wherein $D=(Ns/Nm)*(Rgs/Rgm)$ is satisfied,
   where Nm indicates a number of the plurality of cells in the main region and Ns indicates a number of the plurality of cells in the sensing region.

8. The semiconductor device according to claim 6, wherein $D=(Ss/Sm)*(Rgs/Rgm)$ is satisfied,
   where Sm indicates an area of the main region and Ss indicates an area of the sensing region.

9. The semiconductor device according to claim 6, wherein D is set at $0<D<1$.

10. The semiconductor device according to claim 6, wherein the transistor comprises an insulated-gate bipolar transistor (IGBT) including a collector terminal, a gate terminal, and at least two emitter terminals.

11. The semiconductor device according to claim 6, wherein the CR delay ratio indicates a ratio between CR for the sensing region and CR for the main region.

* * * * *